United States Patent
Lim

(10) Patent No.: US 9,455,051 B1
(45) Date of Patent: Sep. 27, 2016

(54) COMPENSATION CIRCUIT AND COMPENSATION METHOD

(71) Applicant: SK hynix Inc., Icheon-si Gyeonggi-do (KR)

(72) Inventor: Sung Gu Lim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/071,338

(22) Filed: Mar. 16, 2016

(30) Foreign Application Priority Data

Oct. 27, 2015 (KR) .......................... 10-2015-0149543

(51) Int. Cl.
*G11C 7/00* (2006.01)
*G11C 29/00* (2006.01)
*G11C 7/06* (2006.01)
*G11C 8/10* (2006.01)
*G11C 8/08* (2006.01)

(52) U.S. Cl.
CPC .............. *G11C 29/812* (2013.01); *G11C 7/06* (2013.01); *G11C 8/08* (2013.01); *G11C 8/10* (2013.01); *G11C 29/781* (2013.01)

(58) Field of Classification Search
CPC ........... G11C 7/06; G11C 7/065; G11C 7/16; G11C 11/4063
USPC ................... 365/196, 205, 185.21
See application file for complete search history.

(56) References Cited

U.S. PATENT DOCUMENTS

| 2013/0058172 | A1* | 3/2013 | Rao ............ G11C 29/026 365/189.05 |
| 2014/0119094 | A1* | 5/2014 | Lee ............ G11C 13/004 365/148 |
| 2015/0036444 | A1 | 2/2015 | Seo |

FOREIGN PATENT DOCUMENTS

KR 1020110095022 A 8/2011

* cited by examiner

*Primary Examiner* — Han Yang
(74) *Attorney, Agent, or Firm* — William Park & Associates Ltd.

(57) ABSTRACT

Provided is a compensation circuit including a memory cell array including a normal area and a redundancy area for repairing defects occurred in the normal area, a compensation time control circuit that activates a compensation start signal for a sense amplifier coupled to the normal area and the redundancy area in response to an active command, and a compensation control signal generation circuit that starts a compensation operation in response to the compensation start signal, and stops a compensation start signal for a sense amplifier coupled to an unselected word line in response to a fuse compare completion pulse and a compare address.

20 Claims, 7 Drawing Sheets

COMPENSATION CIRCUIT AND COMPENSATION METHOD

CROSS-REFERENCES TO RELATED APPLICATION

The present application claims priority under 35 U.S.C. §119(a) to Korean application number 10-2015-0149543, filed on Oct. 27, 2015, in the Korean Intellectual Property Office, which is incorporated herein by reference in its entirety.

BACKGROUND

1. Technical Field

Various embodiments generally relate to a compensation circuit and a compensation method, and more particularly to a compensation circuit and a compensation method to simultaneously start a fuse compare and compensation operation, and immediately stop the fuse compare for areas requiring no compensation operation.

2. Related Art

A memory device, which includes a memory cell for data writing, performs an operation for writing data in the memory cell or reading data from the memory cell.

The memory cell is coupled between a word line and a bit line crossing the word line to store charge. The charge stored in the memory cell is amplified to a voltage difference between the bit line and a complementary bit line, so that data is read.

A sense amplifier may be coupled to a bit line pair including the bit line and the complementary bit line. The sense amplifier performs an operation for amplifying such a voltage difference, wherein semiconductor elements constituting the sense amplifier performs an unideal operation due to a process variation or an operation temperature. Thus an offset may occur among the semiconductor elements constituting the sense amplifier. The offset which occurs in the sense amplifier may have an influence on an effective sensing margin in the process of converting the voltage difference read from the bit line pair into data.

SUMMARY

In a compensation circuit and a compensation method according to various embodiments, a compensation operation is started to remove an offset in response to an active command or ensure an effective sensing margin. The compensation operation and fuse compare are performed in parallel, resulting in reduction of a time (for example, $t_{RCD}$) required for finally activating a word line.

In the compensation circuit and the compensation method according to various embodiments, when the fuse compare is completed while the compensation operation is being performed, the compensation operation is stopped for an unselected word line. Consequently, it is possible to minimize power consumption which may occur when the compensation operation is performed for all sense amplifiers coupled to a redundancy area before the fuse compare is completed.

In an embodiment, a compensation circuit includes: a memory cell array including a normal area and a redundancy area for repairing defects occurred in the normal area; a compensation time control circuit that activates a compensation start signal for a sense amplifier coupled to the normal area and the redundancy area in response to an active command; and a compensation control signal generation circuit that starts a compensation operation in response to the compensation start signal, and terminates a compensation operation for a sense amplifier coupled to an unselected word line in response to a fuse compare completion pulse and a compare address.

In another embodiment, a compensation method includes the steps of: activating a compensation start signal for a sense amplifier coupled to a selected word line and a redundancy area of a memory cell array indicated by an address, in response to an active command; performing fuse compare based on the address in response to the active command to derive a compare address, and generating a fuse compare completion pulse as the compare address is derived; and starting a compensation operation in response to the compensation start signal and stopping a compensation operation for a sense amplifier coupled to an unselected word line in response to the fuse compare completion pulse.

In the compensation circuit and the compensation method according to various embodiments, a fuse compare operation for determining whether to repair a row address of a memory cell and a compensation operation are simultaneously performed in response to an active command, so that it is possible to shorten a time required for an entire active operation.

In the compensation circuit and the compensation method according to various embodiments, a compensation operation is stopped for an area of an unselected word line, for which the compensation operation is being performed, at a time at which a fuse compare operation is completed, so that it is possible to reduce power consumption.

DETAILED DESCRIPTION

Hereinafter, a compensation circuit and a compensation method will be described below with reference to the accompanying drawings through various example embodiments.

Figure 1:
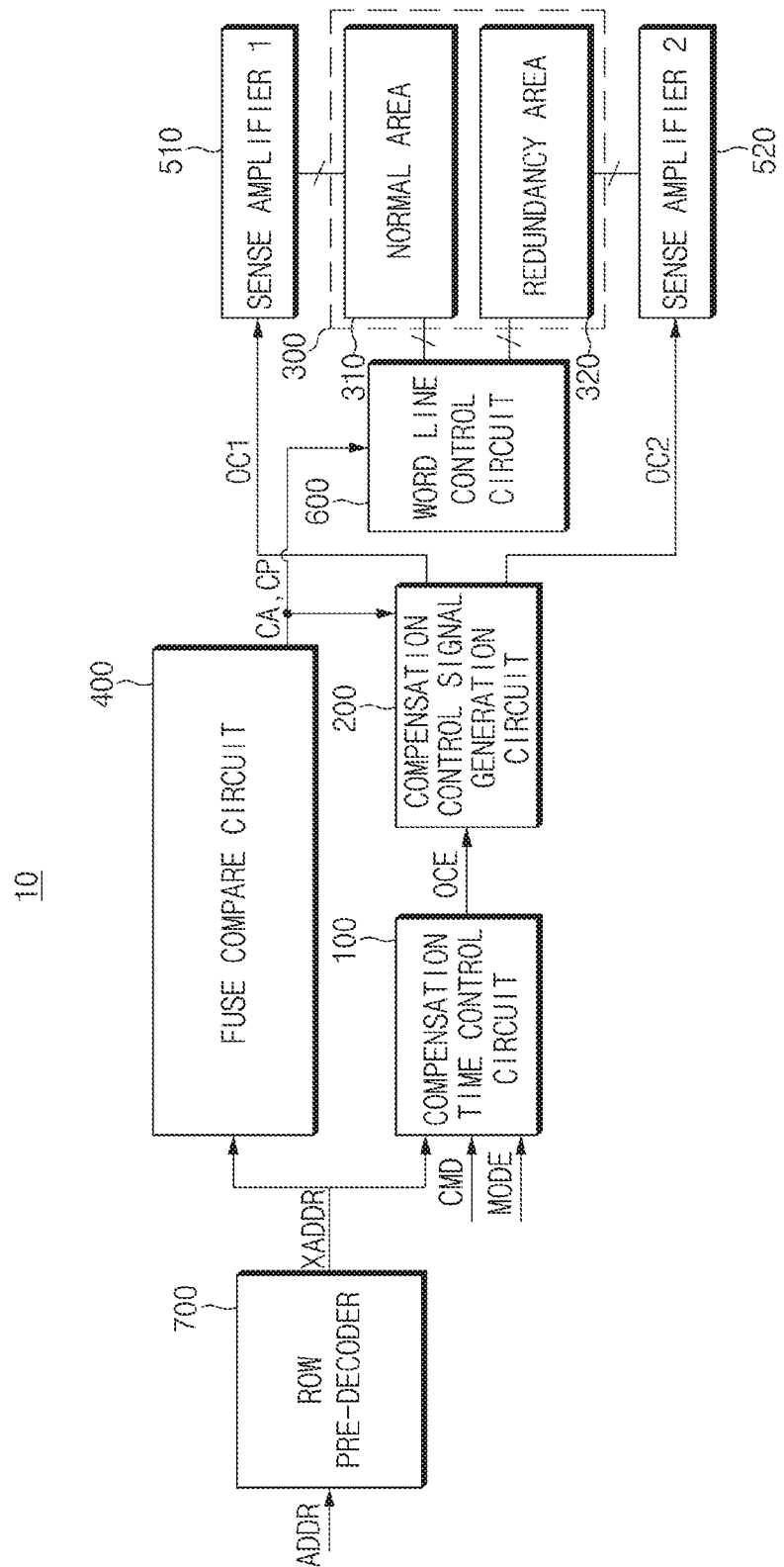
FIG. 1 is a block diagram illustrating a compensation circuit according to an embodiment.

FIG. 1 is a block diagram illustrating a compensation circuit according to an embodiment.

Referring to FIG. 1, a compensation circuit 10 according to an embodiment may include a compensation time control circuit 100, a compensation control signal generation circuit 200, and a memory cell array 300. According to an embodiment, the compensation circuit 10 may also include a word line control circuit 600.

The compensation time control circuit 100 may activate a compensation start signal OCE based on a command, particularly, an active command CMD. The compensation start signal OCE generated in the compensation time control circuit 100 may correspond to a signal instructing a start of a compensation operation for sense amplifiers 510 and 520 coupled to at least one memory cell of the memory cell array 300.

The compensation time control circuit 100 may generate compensation start signals OCE having different values and provide the compensation start signals OCE to each sense amplifier of the memory cell array 300 at substantially the same time.

The memory cell array 300 may include a normal area 310 and a redundancy area 320, where the redundancy area 320 may be used for repairing defects which may occur in the normal area 310. The memory cell array 300 may include a volatile memory cell of a SRAM (Static RAM), a DRAM (Dynamic RAM), a SDRAM (Synchronous DRAM) and the like. The memory cell array 300 may also include a non-volatile memory cell of a ROM (Read Only Memory), a PROM (Programmable ROM), an EEPROM (Electrically Erasable and Programmable ROM), an EPROM (Electrically Programmable ROM), a flash memory, a PRAM (Phase RAM), a MRAM (Magnetic RAM), a RRM (Resistive RAM), a FRAM (Ferroelectric RAM) and the like.

For example, data may be written to or read from a specific address of the normal area 310 based on an address ADDR. When a memory cell corresponding to an address fails, a fuse compare circuit 400 may drive the received address ADDR and store repair information as a compare address.

In other words, when defects occurred in accessing an address positioned in the normal area 310, a role of the fuse compare circuit 400 is to translate or convert the normal area 310 address into an address of the redundancy area 320.

In a general case, a compensation operation is not performed when the address ADDR is applied and the fuse compare circuit 400 derives a compare address CA including information on a selected word line and an unselected word line in the compare address CA. In one example, the fuse circuit 400 may generate the fuse compare completion pulse CP when derivation of the compare address CA is completed. A compensation operation is not performed because an active operation may be performed for a memory cell having a position different from a position indicated by the address ADDR. Accordingly, since it is not possible to know the position at which the compensation operation is performed, the compensation operation may be performed based on the compare address CA provided by the fuse compare circuit 400.

However, as the compensation operation is performed after completion of the fuse compare, since much time is required until for example, a read operation is performed after the active command is applied, operation speed of the compensation circuit 10 may slow.

The compensation circuit 10 according to an embodiment simultaneously starts the fuse compare and the compensation operation in response to an active command CMD. The compensation time control circuit 100 activates the compensation start signal OCE such that a compensation operation is performed for all sense amplifiers coupled to the redundancy area 320 in response to the active command CMD and a sense amplifier coupled to a word line determined to be selected in the normal area 310 based on a row address XADDR.

For example, when there are no defects in the normal area 310 in a position indicated by the address ADDR, an operation is performed for the address ADDR. When, however, there are defects in the normal area 310 with the position indicated by the address ADDR, an operation is performed in the redundancy area 320 at a position indicated by the compare address CA obtained by repairing the address ADDR.

Since the compensation circuit 10 may start a compensation operation before a fuse compare is completed, the compensation operation is started in an initial step for a selected address in the normal area 310 indicated by the address ADDR and sense amplifiers coupled to the redundancy area 320. For the start of the compensation operation, the compensation time control circuit 100 may activate the compensation start signal OCE.

The compensation start signal OCE is not activated for sense amplifiers coupled to other areas except for the selected word line indicated by the address ADDR.

In response to the compensation start signal OCE, the compensation control signal generation circuit 200 provides first and second compensation control signals OC1 and OC2 the sense amplifiers 510 and 520. The first and second control signals OC1 and OC2 may be for performing a compensation operation. The sense amplifiers 510 and 520 may be coupled to an area of a memory cell array, in which a selected word line of the normal area 310 indicated by the address ADDR is positioned, and the redundancy area 320.

Although not illustrated in the drawing, the sense amplifiers 510 and 520 include elements capable of compensating for an offset with respect to bit line pairs thereof. In the present specification, a description of a detailed operation of offset compensation will be omitted.

According to embodiments, the compensation control signal generation circuit 200 may receive a mode signal MODE, and activate the compensation start signal OCE with respect to a selected word line indicated by the address ADDR and the redundancy area 320 in response to the active command CMD. The compensation control signal circuit 200 may also activate the compensation start signal OCE in response to with respect to a selected word line indicated by the compare address CA in response to a fuse compare completion pulse CP.

In other words, the compensation control signal generation circuit 200 may start a compensation operation before a fuse compare operation is completed based on the mode signal MODE, or may start the compensation operation after the fuse compare operation is completed.

According to embodiments, when a read (Read) operation is performed after the active command CMD based on the mode signal MODE, the compensation control signal generation circuit 200 may start a compensation operation in response to only the active command CMD before the fuse compare is completed. That is, when the read operation is performed, the compensation control signal generation circuit 200 may activate the compensation start signal OCE so that a fuse compare operation and a compensation operation are performed in a parallel manner.

Furthermore, in a write (Write) operation, the compensation control signal generation circuit 200 may also activate the compensation start signal OCE only for a sense amplifier coupled to a selected address indicated by the compare address CA after completion of the entire fuse compare according to a general scheme.

The fuse compare circuit 400 may generate the compare address CA by performing a fuse compare operation based on the row address XADDR obtained by decoding the address ADDR. The fuse compare circuit 400 may generate the pulse type fuse compare completion pulse CP when the fuse compare is completed.

As described above, since the address ADDR may or may not be repaired, the compare address CA may indicate a position different from or substantially equal to that of the address ADDR.

In response to the fuse compare completion pulse CP, the compensation control signal generation circuit 200 immediately stops a compensation operation for other sense amplifiers except for a sense amplifier coupled to a selected word line. The compensation control signal generation circuit 200 may stop the compensation operation based on the fuse compare completion pulse CP and the compare address CA provided by the fuse compare circuit 400.

Among the sense amplifiers for which the compensation control signal generation circuit 200 has started the compensation operation in response to the active command CMD as described above, at least one is a sense amplifier coupled to a selected word line based on the compare address CA. Accordingly, the compensation operation may be continuously performed for a sense amplifier coupled to a selected word line for which the compensation operation has been started together with the fuse compare operation of the fuse compare circuit 400.

Among the compensation operations having been started for the word line (indicated by the address ADDR) and the sense amplifier (coupled to the redundancy area 320) in a situation in which it is not possible to know the position of a selected word line because fuse compare has not completed, the compensation operation may be immediately stopped for the sense amplifiers coupled to unselected word lines not indicated by the compare address CA.

According to such an operation, the compensation circuit 10 according to an embodiment not only minimizes a time required for a compensation operation, but may also reduce power consumption.

The word line control circuit 600 activates a word line, which in one example is a selected word line, of the memory cell array 300 based on the compare address CA in response to activation, in one example, of a fuse compare completion pulse CP, and, illustratively, deactivation of the compensation start signal OCE. The word line control circuit 600 may generate a word line activation signal and provide the word line activation signal to the word line of the memory cell array 300 corresponding to the compare address CA, that is, a selected word line. The word line control circuit 600 may also provide other unselected word lines with a signal having a voltage value opposite to that of the word line activation signal provided to the selected word line.

According to an embodiment, the word line control circuit 600 may generate a word line activation signal WLE after the passage of a preset time in response to the fuse compare completion pulse CP.

The selected address indicated by the compare address CA may be positioned in the normal area 310 or the redundancy area 320. For example, since the memory cell array 300 may be divided into areas such as banks, pages, and mats MAT and a sense amplifier may be provided to each area, a compensation operation may be substantially maintained as is for a sense amplifier regardless of reception of the fuse compare completion pulse CP. The sense amplifier may have been coupled to a specific area of the memory cell array 300 in which the selected address indicated by the compare address CA is positioned.

According to an embodiment, the compensation circuit 10 may further include a row pre-decoder 700. The row pre-decoder 700 may receive the address ADDR and decode the address ADDR into the row address XADDR, and provide the row address XADDR to the fuse compare circuit 400 and the compensation time control circuit 100.

Figure 2:
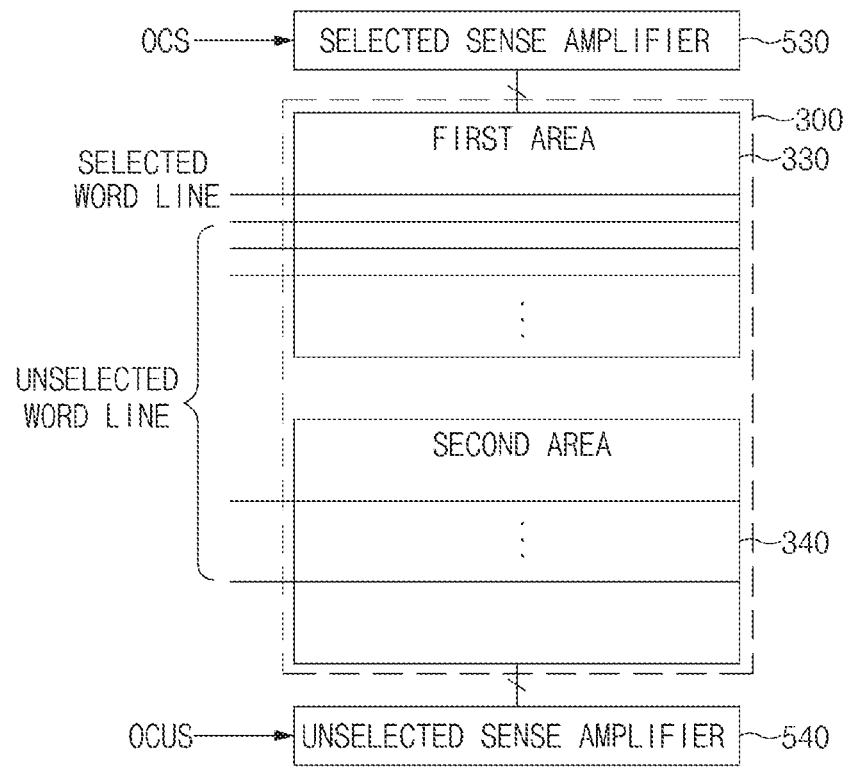
FIG. 2 is a diagram for explaining compensation signals provided to a selected word line and an unselected word line from a compensation control signal generation circuit according to an embodiment.

FIG. 2 is a diagram for explaining compensation signals provided to a selected word line and an unselected word line from the compensation control signal generation circuit according to an embodiment.

Referring to FIG. 2, a memory cell array 300 may be divided into a first area 330 and a second area 340 based on the compare address CA. The first area 330 may be an area in which a selected word line is positioned. The memory cell array 300 illustrated in FIG. 2 is substantially equal to the memory cell array 300 illustrated in FIG. 1, and may be divided into the first area 330 and the second area 340 based on a position of a selected word line indicated by the compare address CA.

In some examples, the first area 330 may be coupled to a selected sense amplifier 530 and subjected to a data input/output operation, and the second area 340 may be coupled to an unselected sense amplifier 540.

FIG. 1 illustrates that the compensation control signal generation circuit 200 activates the compensation start signal OCE for a sense amplifier coupled to a selected word line positioned of the normal area 310 and all sense amplifiers of the redundancy area 320 based on the address ADDR. As described above, the selected word line indicated by the compare address CA may be included in any one of the normal area 310 and the redundancy area 320 based on the address ADDR.

Accordingly, the first area 330 and the second area 340 of FIG. 2 may be understood as a concept where some areas of the memory cell array 300 have been divided again into the first area 330, in which a selected word line is positioned, and the second area 340. In one example delineation, the first area 330 and the second area 340 may be chosen based on the compare address CA. In such a memory cell array 330, the compensation start signal OCE may be activated before a fuse compare operation is completed.

The compensation control signal generation circuit 200 may deactivate a non-selection compensation control signal OCUS provided to the unselected sense amplifier 540 in response to the fuse compare completion pulse CP. When the non-selection compensation control signal OCUS is deactivated, memory cells coupled to an unselected word line may be in a standby state. The compensation control signal generation circuit 200 continuously and substantially maintains an activated state of a selection compensation control signal OCS provided to the selected sense amplifier 530.

Hereinafter, a compensation circuit and a compensation method according to an embodiment will be described based on the concept of the selection compensation control signal OCS and the non-selection compensation control signal OCUS.

Figure 3:
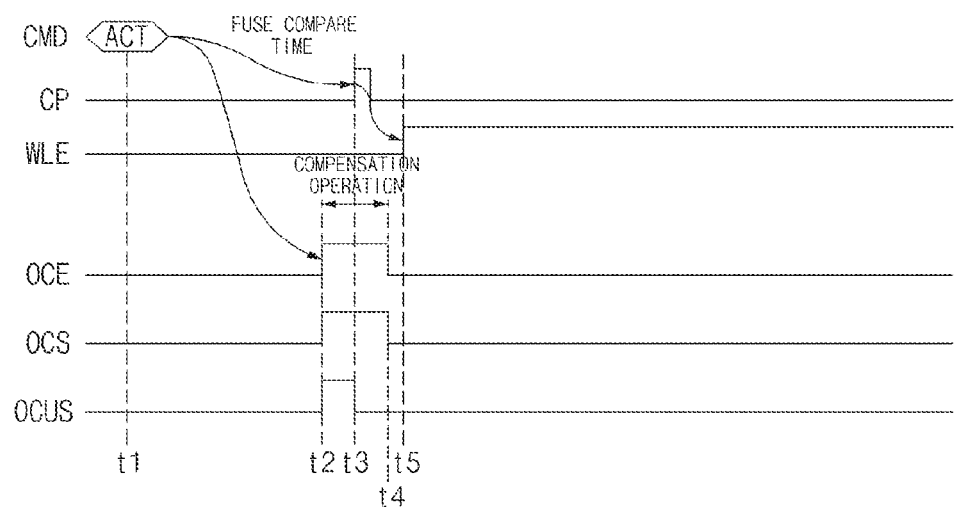
FIG. 3 is a waveform diagram for explaining an operation of a compensation circuit according to an embodiment.

FIG. 3 is a waveform diagram for explaining an operation of the compensation circuit according to an embodiment.

Referring to FIG. 3, at a time t1, the fuse compare circuit 400 starts a fuse compare operation in response to the active command CMD. Furthermore, the compensation time control circuit 100 activates the compensation start signal OCE in response to the active command CMD at a time t2.

The selection compensation control signal OCS and the non-selection compensation control signal OCUS are activated in response to the compensation start signal OCE, so that a compensation operation is started for a sense amplifier coupled to a selected word line indicated by the address ADDR and a sense amplifier coupled to a redundancy area.

At a time t3, the fuse compare operation of the fuse compare circuit 400 is completed, so that the fuse compare completion pulse CP is generated. As the fuse compare completion pulse CP is generated, the compare address CA may be provided to the compensation control signal generation circuit 200 and the word line control circuit 600.

The compensation control signal generation circuit 200 immediately responds to the fuse compare completion pulse CP and deactivates the non-selection compensation control signal OCUS such that an unnecessary compensation operation is stopped, thereby stopping a compensation operation for sense amplifiers (the unselected sense amplifier 540 of FIG. 2) coupled to unselected word lines.

The selection compensation control signal OCS provided to sense amplifiers is coupled to the compare address CA, that is, the selected sense amplifier 530 of FIG. 2 continues until the compensation operation is completed regardless of the fuse compare completion pulse CP, and the selected sense amplifier 530 is deactivated at a time t4.

The word line control circuit 600 generates the word line activation signal WLE that activates a selected word line in response to the fuse compare completion pulse CP at a time t5 having passed a preset time.

As described with reference to FIG. 3, the compensation circuit may start a compensation operation in response to an active command CMD, so that it is possible to reduce $t_{RCD}$ compared with starting the compensation operation for a selected word line after a fuse compare is completed.

When the compensation operation is started after the fuse compare is completed, a word line may be activated and an operation may be performed after at least an offset compensation operation time passes from the time t2 to the time t4 after the time t3.

However, a compensation operation may not be completed up to a time at which the word line activation signal WLE is generated in response to the activation of the fuse compare completion pulse CP after passage of a preset time.

Figure 4:
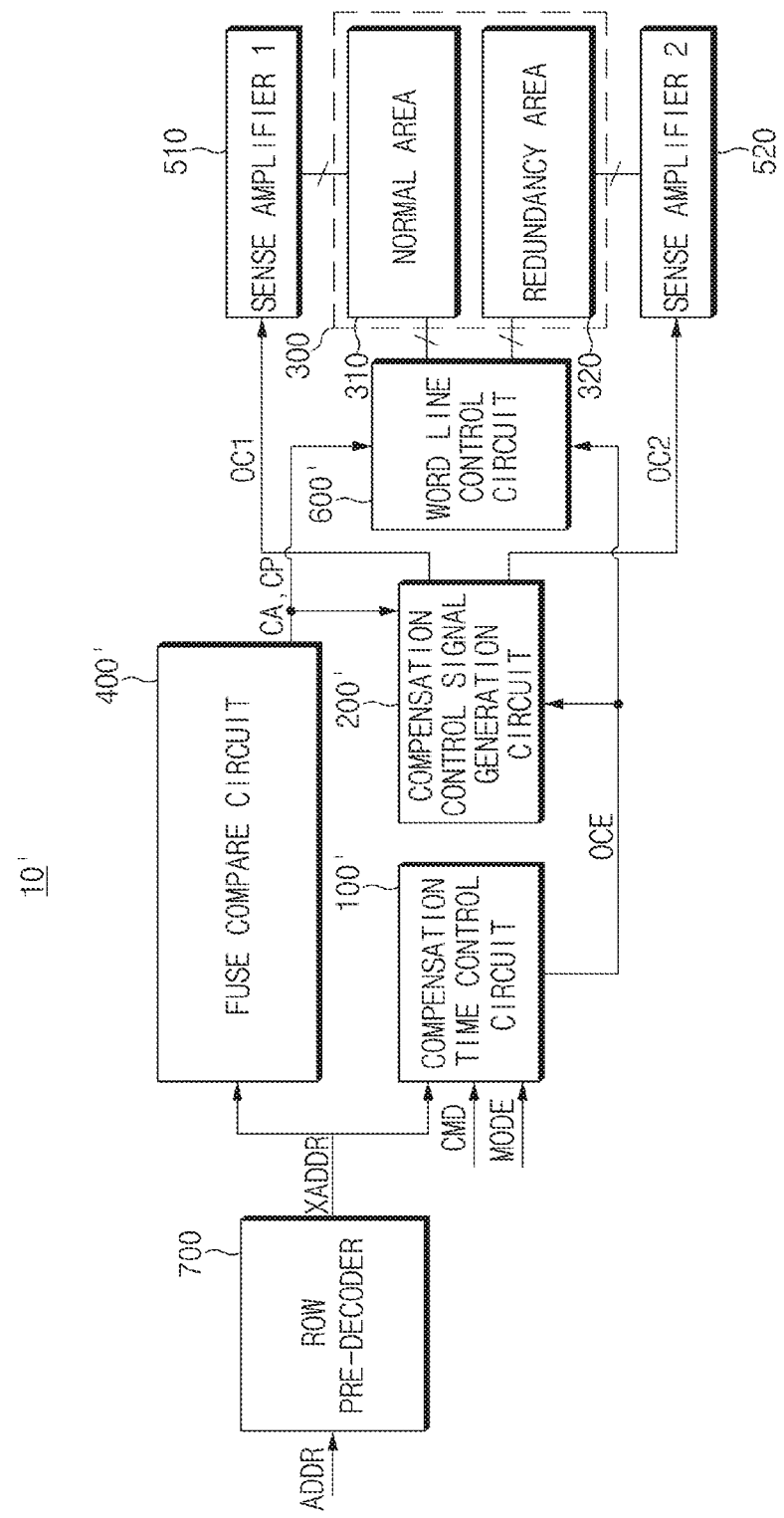
FIG. 4 is a block diagram illustrating a compensation circuit according to an embodiment.

FIG. 4 is a block diagram illustrating a compensation circuit according to another embodiment.

Referring to FIG. 4, a compensation circuit 10' may be different from the compensation circuit 10 illustrated in FIG. 1 in that the compensation start signal OCE generated by a compensation time control circuit 100' is provided to a compensation control signal generation circuit 200' and a word line control circuit 600'.

Since the other elements have characteristics substantially equal to those described with reference to FIG. 1, the same reference numerals are used and a detailed description of substantially the same elements will be omitted.

The compensation time control circuit 100' activates the compensation start signal OCE based on the row address XADDR obtained by decoding the address ADDR and the active command CMD.

When a compensation operation is completed after the compensation start signal OCE is activated, the compensation time control circuit 100' may deactivate the compensation start signal OCE to indicate a period in which the compensation operation for the sense amplifier 530 coupled to the selected word line is completed.

The compensation control signal generation circuit 200' activates signals (for example, the first and second compensation control signals OC1 and OC2 of FIG. 1 and the selection compensation control signal OCS and the non-selection compensation control signal OCUS of FIG. 2) for controlling a compensation operation in response to the compensation start signal OCE.

The compensation control signal generation circuit 200's deactivates the non-selection compensation control signal OCUS and substantially maintains an activated state of the selection compensation control signal OCS in response to the fuse compare completion pulse CP.

The word line control circuit 600' may receive the fuse compare completion pulse CP and the compensation start signal OCE, and provide the word line activation signal WLE to a selected word line in response to the fuse compare completion pulse CP when a preset time passes. Alternatively, the word line control circuit 600' may provide the word line activation signal WLE to a selected word line in response to the deactivation of the compensation start signal OCE as illustrated in FIG. 1.

The time at which the word line control circuit 600' activates the word line activation signal WLE may differ according to a time at which a compensation operation is completed. Accordingly, after the fuse compare completion pulse CP and the compensation start signal OCE are received, when the fuse compare completion pulse CP has been activated and the compensation start signal OCE has been deactivated, the word line control circuit 600' may also provide the word line activation signal WLE to a selected word line.

Figure 5:
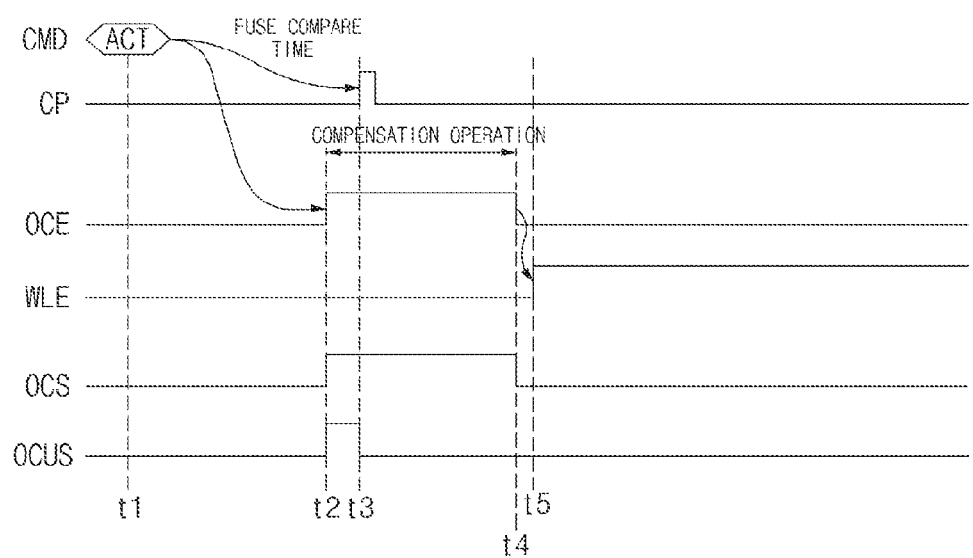
FIG. 5 is a waveform diagram for explaining operation of a compensation circuit according to an embodiment.

FIG. 5 is a waveform diagram for explaining an operation when a compensation operation has not been completed after the fuse compare completion pulse CP is generated. The fuse completion pulse CP may be generated because a time required for the compensation operation is relatively longer than a fuse compare time.

Referring to FIG. 5, at a time t1, a fuse compare circuit 400' performs a fuse compare operation in response to generation of the active command CMD, and the compensation control signal generation circuit 200' activates the compensation start signal OCE to start a compensation operation.

At a time t2, in response to the activated compensation start signal OCE, the compensation control signal generation circuit 200' activates the selection compensation control signal OCS and the non-selection compensation control signal OCUS.

As the fuse compare circuit 400' completes a fuse compare, the fuse compare completion pulse CP is generated at a time t3. The fuse compare completion pulse CP is provided to the compensation control signal generation circuit 200', so that the non-selection compensation control signal OCUS is deactivated.

The selection compensation control signal OCS is in the activated state during a compensation operation regardless of the fuse compare completion pulse CP.

Since the compare address CA has been derived, the word line control circuit 600' may also activate the word line activation signal WLE and provide the word line activation signal WLE to a selected word line in response to the fuse compare completion pulse CP after a preset time (see FIG. 3), but when the selected word line is activated in a state in which the compensation operation has not been completed, an operation error may occur.

Accordingly, as the compensation operation is completed at a time t4, when the compensation start signal OCE is deactivated and the selection compensation control signal OCS is deactivated, the word line control circuit 600' may provide the word line activation signal WLE to a selected word line at a time t5 in response to the compensation start signal OCE.

According to an embodiment, the word line control circuit 600' may decide the activation time of the word line activation signal WLE based on all the fuse compare completion pulse CP and the compensation start signal OCE, or decide the activation time of the word line activation signal WLE based on only the compensation start signal OCE or only the fuse compare completion pulse CP.

Figure 6:
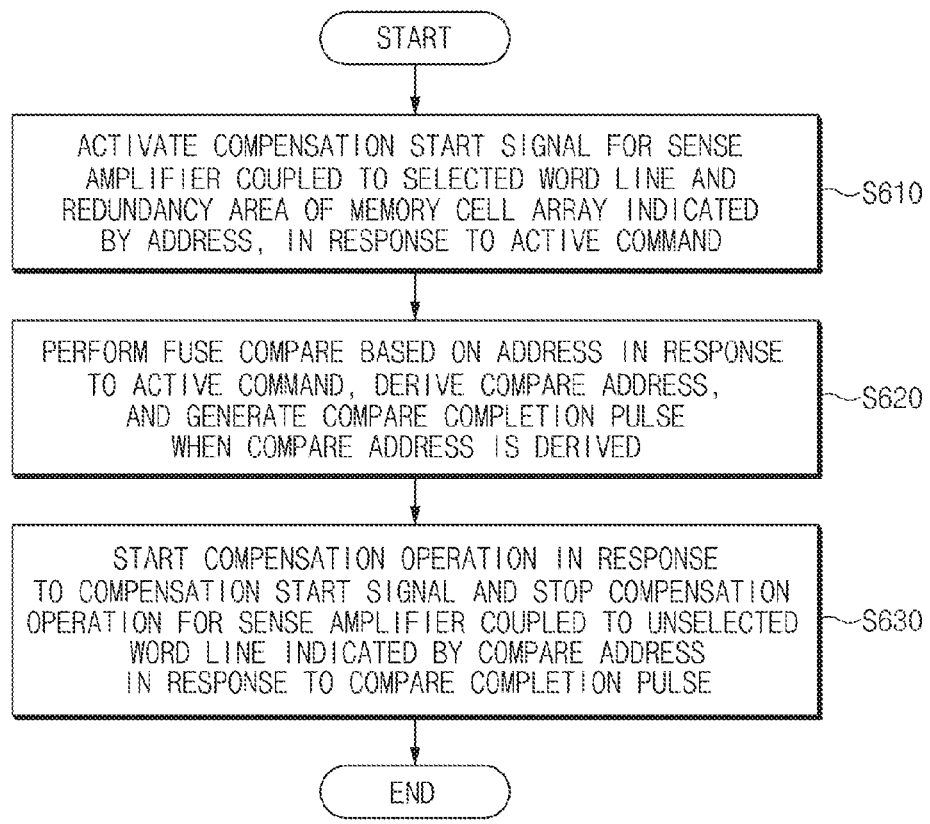
FIG. 6 is a flowchart for explaining a compensation method according to an embodiment.

FIG. 6 is a flowchart for explaining a compensation method according to an embodiment.

The compensation method illustrated in FIG. 6 may be performed by the compensation circuits 10 and 10' described with reference to FIG. 1 and FIG. 4. Hereinafter, the compensation method according to an embodiment will be described with reference to FIG. 1 to FIG. 4.

Referring to FIG. 6, the compensation time control circuit 100 activates the compensation start signal OCE for a sense amplifier coupled to a selected word line and the redundancy area 320 of the memory cell array 300 indicated by the address ADDR, in response to the active command CMD (step S610).

According to an embodiment, the compensation time control circuit 100 activates the compensation start signal OCE for a sense amplifier coupled to a selected word line of the memory cell array 300 indicated by the address ADDR. The compensation time control circuit 100 may activate the compensation start signal OCE based on the row address XADDR decoded through the row pre-decoder 700. The selected word line of the memory cell array 300 indicated by the address ADDR may be positioned in the normal area 310.

The fuse compare circuits 400 and 400' perform a fuse compare based on the address ADDR in response to the active command CMD to derive the compare address CA (step S620). The fuse compare completion pulse CP may be generated as the compare address CA is derived. When there are no defects in the memory cell array of a position indicated by the address ADDR, the compare address CA is substantially equal to the address ADDR. However, when the address ADDR indicates a position in which defects have occurred, a repair is performed, so that the compare address CA may be positioned in the redundancy area 320.

The compensation control signal generation circuits 200 and 200' may preferentially start a compensation operation with respect to the selected word line indicated by the address ADDR and a redundancy area in response to the compensation start signal OCE. Furthermore, the compensation control signal generation circuits 200 and 200' substantially maintain the compensation operation with respect to a selected word line indicated by the compare address CA and stop the compensation operation for a sense amplifier coupled to unselected word lines in response to the fuse compare completion pulse CP from the fuse compare circuits 400 and 400' (step S630).

According to the an embodiment, the word line control circuit 600 may provide an activated word line activation signal WLE to activate the selected word line indicated by the compare address CA when a preset time passes after the fuse compare completion pulse CP is generated, so that a read or write operation may be performed. In other words, activation of the selected word line may be indicated by the compare address CA based on at least one of generation of the fuse compare completion pulse CP and deactivation of the compensation start signal OCE.

According to other embodiments, when the compensation operation is completed for the selected word line indicated by the compare address CA, the compensation control signal generation circuits 200 and 200' deactivate the compensation start signal OCE.

The word line control circuit 600' may receive the fuse compare completion pulse CP from the fuse compare circuit 400', and may receive the compensation start signal OCE from the compensation control signal generation circuit 200' so that the fuse compare completion pulse CP is generated, and word line control circuit 600' may also provide the word line activation signal WLE to the selected word line when a preset time passes after the compensation start signal OCE is deactivated.

Furthermore, the compensation control signal generation circuits 200 and 200' according to an embodiment may receive the mode signal MODE. The compensation control signal generation circuits 200 and 200' may also activate the compensation start signal OCE in response to the active command CMD and/or activate the compensation start signal OCE in response to the fuse compare completion pulse CP according to the mode signal MODE.

As described above, in the compensation circuits 10 and 10' and the compensation method according to the embodiments, a fuse compare and a compensation operation are simultaneously started in response to the active command CMD, so that it is possible to reduce the delay of an operation time, which occurs when the compensation operation is performed after the fuse compare.

Furthermore, in the compensation circuits 10 and 10' and the compensation method according to the embodiments, a compensation operation for areas requiring no compensation operation is immediately stopped in response to the completion of fuse compare, so that it is possible to minimize power consumption.

The semiconductor devices and/or compensation circuits discussed above (see FIGS. 1-6) are particularly useful in the design of memory devices, processors, and computer systems. For example, referring to FIG. 7, a block diagram of a system employing a semiconductor device and/or compensation circuits in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or compensation circuit as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or compensation circuit as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor device and/or a compensation circuit as discussed above with relation to FIGS. 1-6. In alternate embodiments, such as, for example but not limited to, cellular phones or digital cameras, the components may differ from the embodiments illustrated in FIG. 7.

Figure 7:
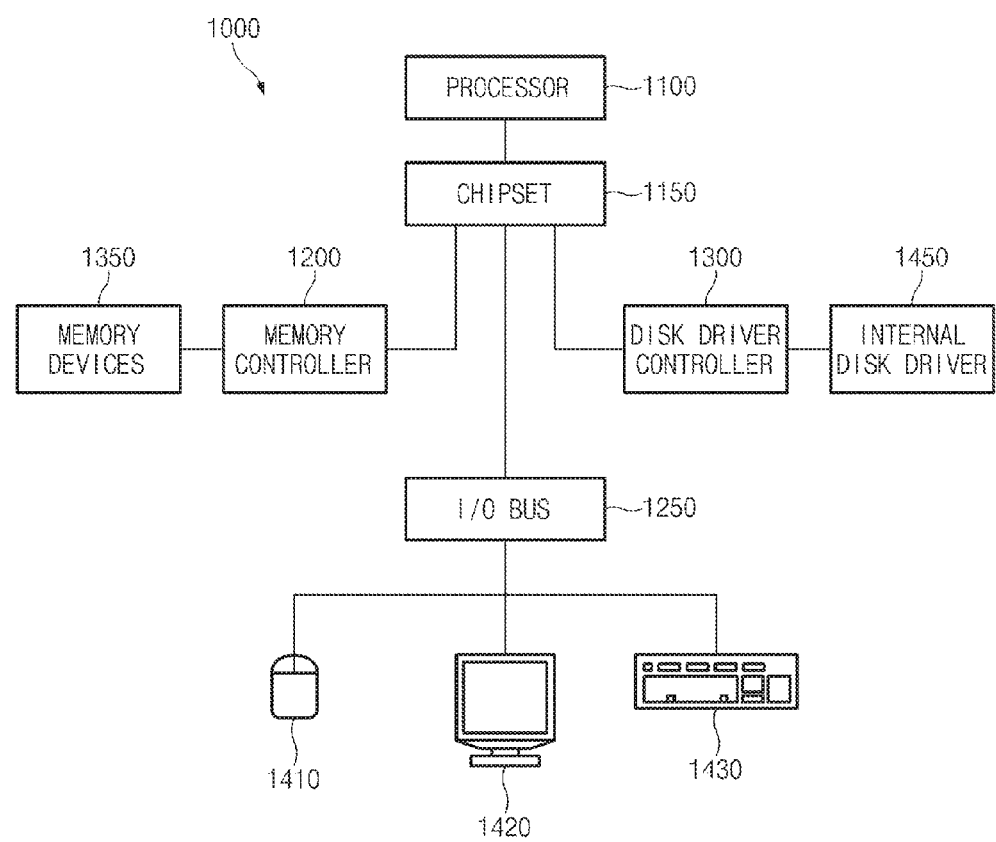
FIG. 7 illustrates a block diagram of an example representation of a system employing a semiconductor device in accordance with the various embodiments discussed above with relation to FIGS. 1-6.

FIG. 7 illustrates a block diagram of an example of a representation of a system employing semiconductor devices and/or a compensation circuits in accordance with the various embodiments discussed above with relation to FIGS. 1-6.

While various embodiments have been described above, it will be understood by those skilled in the art that the embodiments described are by way of example only. Accordingly, the compensation circuit and the compensation method described herein should not be limited based on the described embodiments.

What is claimed is:

1. A compensation circuit comprising:
   a memory cell array including a normal area and a redundancy area for repairing defects occurred in the normal area;
   a compensation time control circuit configured to activate a compensation start signal for a sense amplifier coupled to the normal area and the redundancy area in response to an active command; and
   a compensation control signal generation circuit configured to start a compensation operation in response to the compensation start signal, and terminate a compensation operation for a sense amplifier coupled to an unselected word line in response to a fuse compare completion pulse and a compare address.

2. The compensation circuit of claim 1, wherein the compensation time control circuit is configured to activate a compensation start signal for a sense amplifier coupled to a selected word line of the normal area based on an address.

3. The compensation circuit of claim 2, wherein the compensation time control circuit is configured to activate a compensation start signal for a sense amplifier coupled to an entire redundancy area.

4. The compensation circuit of claim 3, further comprising:
   a fuse compare circuit configured to derive the compare address including information on the selected word line and the unselected word line in the compare address.

5. The compensation circuit of claim 4, wherein the fuse compare circuit configured to generate the fuse compare completion pulse when derivation of the compare address is completed.

6. The compensation circuit of claim 4, further comprising:
   a word line control circuit configured to activate a word line based on the compare address in response to the fuse compare completion pulse.

7. The compensation circuit of claim 4, wherein the compensation time control circuit is configured to deactivate the compensation start signal when a compensation operation for the sense amplifier coupled to the selected word line is completed.

8. The compensation circuit of claim 7, further comprising:
   a word line control circuit configured to activate a selected word line based on the compare address in response to activation of the fuse compare completion pulse.

9. The compensation circuit of claim 7, further comprising:
   a word line control circuit configured to activate a selected word line based on the compare address in response to activation of the fuse compare completion pulse and deactivation of the compensation start signal.

10. The compensation circuit of claim 4, wherein the compensation time control circuit configured to activate a compensation start signal for the sense amplifier coupled to the selected word line in response to the compare address.

11. The compensation circuit of claim 3, further comprising:
    a row pre-decoder configured to receive the address and decode the address into a row address.

12. A compensation method comprising the steps of:
    activating a compensation start signal for a sense amplifier coupled to a selected word line and a redundancy area of a memory cell array indicated by an address, in response to an active command;
    performing a fuse compare based on the address in response to the active command to derive a compare address, and generating a fuse compare completion pulse as the compare address is derived; and
    starting a compensation operation in response to the compensation start signal and stopping a compensation operation for a sense amplifier coupled to an unselected word line indicated by the compare address in response to the fuse compare completion pulse.

13. The compensation method of claim 12, wherein the compensation method comprises a step of:

substantially maintaining a compensation operation with respect to a selected word line indicated by the compare address.

14. The compensation method of claim 13, further comprising a step of:
activating the selected word line indicated by the compare address when a preset time passes after the fuse compare completion pulse is generated.

15. The compensation method of claim 13, further comprising a step of:
deactivating the compensation start signal when the compensation operation for the selected word line indicated by the compare address is completed.

16. The compensation method of claim 15, further comprising a step of:
activating the selected word line indicated by the compare address based on the generation of the fuse compare completion pulse and the deactivation of the compensation start signal.

17. The compensation method of claim 15, further comprising a step of:
activating the selected word line indicated by the compare address based on the deactivation of the compensation start signal.

18. The compensation method of claim 17, wherein the step of activating the compensation start signal in response to the active command comprises a step of:
activating the compensation start signal in response to the fuse compare completion pulse based on a mode signal and the active command.

19. The compensation method of claim 12, further comprising simultaneously starting the fuse compare and the compensation operation in response to the active command.

20. A compensation circuit configured to simultaneously perform a compensation operation and a fuse compare for activating a word line where the fuse compare operation is performed to determine whether to repair a position indicated by an address of a memory cell, and stopping the compensation operation for an unselected word line in response to a fuse compare completion pulse and a compare address.

* * * * *